United States Patent [19]

Fegley et al.

[11] 4,054,814
[45] Oct. 18, 1977

[54] ELECTROLUMINESCENT DISPLAY AND METHOD OF MAKING

[75] Inventors: Charles Robert Fegley, Laureldale; Frank Joseph Valentino, Wyomissing, both of Pa.

[73] Assignee: Western Electric Company, Inc., New York, N.Y.

[21] Appl. No.: 695,331

[22] Filed: June 14, 1976

Related U.S. Application Data

[63] Continuation-in-part of Ser. No. 627,806, Oct. 31, 1975, abandoned.

[51] Int. Cl.² .................. H01J 7/44; H01J 13/46; H01J 17/34; H01K 1/62
[52] U.S. Cl. .................................... 315/71; 313/512; 315/75; 315/129; 315/135; 357/69; 337/17 D; 339/17 E
[58] Field of Search .................. 357/69, 79, 70; 313/512; 307/311; 339/144 R, 145, 17 D, 17 E; 315/71, 75, 129, 135, 128, 134

[56] References Cited

U.S. PATENT DOCUMENTS

| 870,341 | 11/1907 | Boehm | 339/144 R |
|---|---|---|---|
| 3,597,666 | 8/1971 | Taskovich | 357/79 |
| 3,795,830 | 3/1974 | Richardson | 307/311 |
| 3,869,641 | 3/1975 | Goldberg | 313/512 |
| 3,916,433 | 10/1975 | Schierz | 357/79 |

*Primary Examiner*—Saxfield Chatmon, Jr.
*Attorney, Agent, or Firm*—R. Y. Peters

[57] ABSTRACT

An electroluminescent display device includes at least two elongated, conductive contacts substantially adjacent to and spaced from each other with at least two substantially coextensive ends. A light-emitting element is electrically coupled between the coextensive ends. An elongated insulating base is formed about and between the contacts with their elongated outer edges extending beyond the elongated sides of the base. The base extends substantially the entire length of the outer edges of the contacts and is substantially integral between such contacts.

The device is fabricated in a lead frame environment, wherein the light-emitting element is bonded to a lead frame. A lens is formed over the light-emitting element. The contacts for the device, which may be slidably engageable, are formed from the lead frame. The base is formed contiguous to the lens and over the lead frame to embed the contacts within the base with edges of the contacts extending laterally beyond the surface of the base.

A current-limiting device such as a voltage-dropping resistor or a current-limiting diode may also be embedded within the base, allowing the device to be used over a wide range of operating voltages. The device is ideally suited for replacing on a one-to-one basis switchboard lamps, illuminated key button lamps or the like.

A protective element may be electrically coupled between the coextensive ends of the contacts, allowing the device to be used for circuit protection purposes. Accordingly, upon the occurrence of an overload condition in a circuit coupled to the contact members, the protective element decouples the contact members, resulting in the energization of the light-emitting element.

26 Claims, 13 Drawing Figures

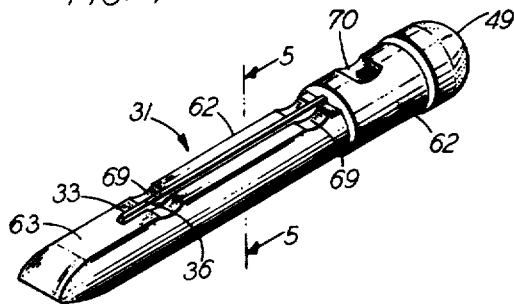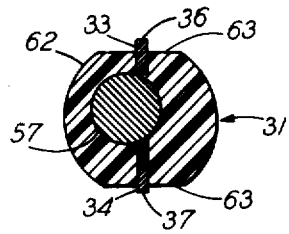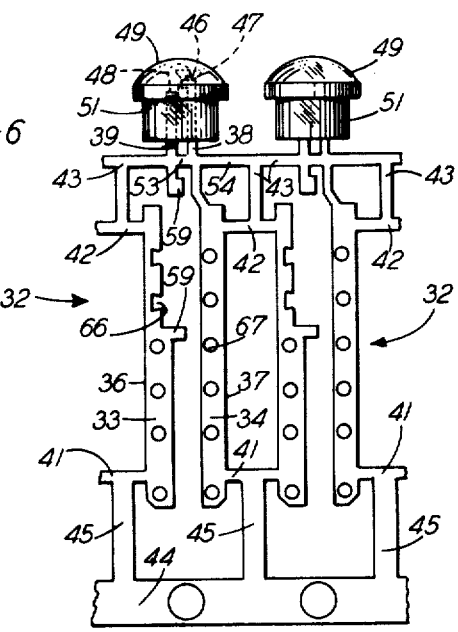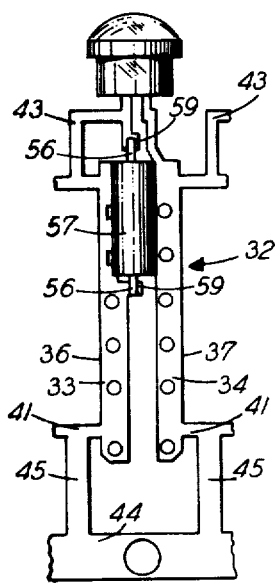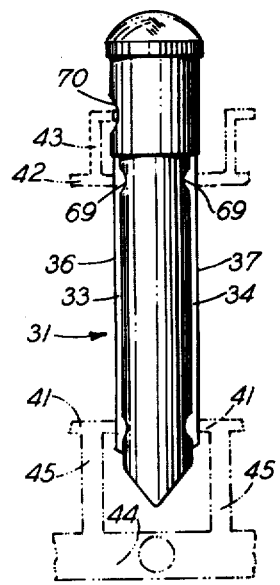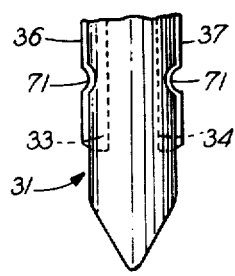

ELECTROLUMINESCENT DISPLAY AND METHOD OF MAKING

CROSS REFERENCE

This application is a continuation-in-part of copending application Ser. No. 627,806, filed Oct. 31, 1975, now abandoned.

BACKGROUND OF THE INVENTION

1. Field of the Invention

This invention relates to electroluminescent display devices and methods of making the same, and more particularly to slidebase, plug-in type devices that use light-emitting diode chips and replace on a one-to-one basis switchboard, key button or similar lamps. As used herein, electroluminescent refers to radiation from electrically excited solid state elements.

2. Description of the Prior Art

Light-emitting diodes of the prior art have been used in making slidebase, plug-in type devices that replace on a one-to-one basis switchboard, key button or similar lamps. Such light-emitting diode devices offer a number of advantages over the conventional carbon and tungsten filament switchboard lamps. These advantages include greatly reduced power consumption, less burn hazard to personnel and materials such as plastics, much longer life, higher reliability and reduced maintenance costs.

However, these prior art devices are expensive owing to a considerable degree to costly prior art assembling techniques that involve complex, tedious, time consuming manual and single-device processing operations. Such prior art devices have either not been assembled in a lead-frame environment or only partially assembled in such an environment, and this has added to their assembling cost. Also contributing to the expense of these prior art devices is the high cost of the piece parts going into the completed assembly.

Other disadvantages of the prior art devices include their lack of compactness and ruggedness. They are susceptible to coming apart; for example, various metal-to-metal and plastic-to-metal bonds have broken.

Still another disadvantage of the prior art devices is their tendency to freely rotate in their sockets, and this on occasion results in their failure to make proper contact for their energization.

In assembling these devices, it is desirable to eliminate as many of the complex, tedious and time consuming manual operations as possible, to assemble these devices in a lead-frame environment using batch processing to the greatest extent possible and at the same time to overcome the above-described disadvantages.

It is also desirable to have the energization of a light-emitting diode device indicate the opening of a protective element by an overload condition in a circuit to which the element is connected, such energization making it readily apparent that such overload condition has occurred. On the other hand, it is difficult in many of the prior art devices to determine if such an overload condition has occurred because it is often not readily apparent that a protective or fusible element has opened a circuit to which it is connected. This problem is compounded when there are many protective elements in the same housing or terminal box, and only one has been subjected to an overload condition, and it therefore is necessary to determine which element of many has been subjected to this condition.

SUMMARY OF THE INVENTION

It is, therefore, an object of this invention to provide new and improved electroluminescent display devices and methods of making the same. Another object of the invention is the provision of improved slidebase, plug-in type devices that use light-emitting diode chips that are assembled in a lead frame environment to overcome many of the disadvantages of the prior art devices.

With these and other objects in view the present invention contemplates a new electroluminescent device having at least two elongated, conductive contact members substantially adjacent to and spaced from each other. The contact members have at least two substantially coextensive ends with a light-emitting element electrically coupled between such ends. An elongated base is formed about and between the contact members with their elongated outer edges extending beyond the elongated sides of the base. The base extends substantially the entire length of the outer edges of the contact members and are substantially integral between such contact members.

In addition, the present invention contemplates a protective element electrically coupled between the contact members so that upon the occurrence of an overload condition in a circuit coupled to the contact members, the protective element decouples the contact members, resulting in the energization of the light-emitting element.

The present invention also contemplates a new method of making an electroluminescent device having a light-emitting element bonded to a lead frame and a lens formed over the light-emitting element, wherein an improvement includes forming slidably engageable contacts for the device from the lead frame. Then, a base for the device is formed contiguous with the lens and over the lead frame to embed the contacts within the base with the edges of the contacts extending laterally beyond the surface of the base.

BRIEF DESCRIPTION OF THE DRAWINGS

Other objects and advantages of the present invention may be more clearly understood by reference to the following detailed description and drawing wherein:

FIG. 4 is a perspective view of an enlarged slidebase, plug-in type light-emitting diode device of the present invention;

FIG. 5 is a cross-sectional view of FIG. 4 taken along lines 5—5 of FIG. 4, showing the edges of a lead frame extending beyond flat surfaces of the slidebase of the device of FIG. 4;

FIGS. 6, 7 and 8 show various stages in the process of assembling the device of FIG. 4;

FIG. 9 shows an alternative embodiment of the present invention;

DETAILED DESCRIPTION

Prior Art Light-Emitting Diode Device

Figure 1:
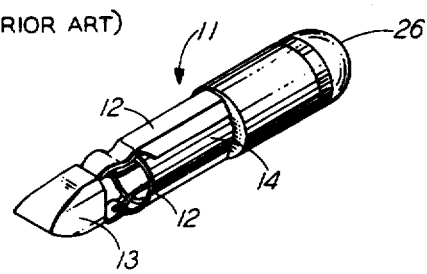
FIG. 1 is an enlarged perspective view of an assembled prior art light-emitting diode device that has a plug-in type slidebase and that replaces on a one-to-one basis a conventional switchboard or similar lamp.

To better understand the present invention and its advantages over the prior art, a light-emitting diode device designated generally by the numeral 11 in FIG. 1, of the prior art will first be briefly described. The prior art device 11 is designed to replace a conventional carbon or tungsten filament switchboard or similar lamp on a one-to-one basis.

Figure 2:
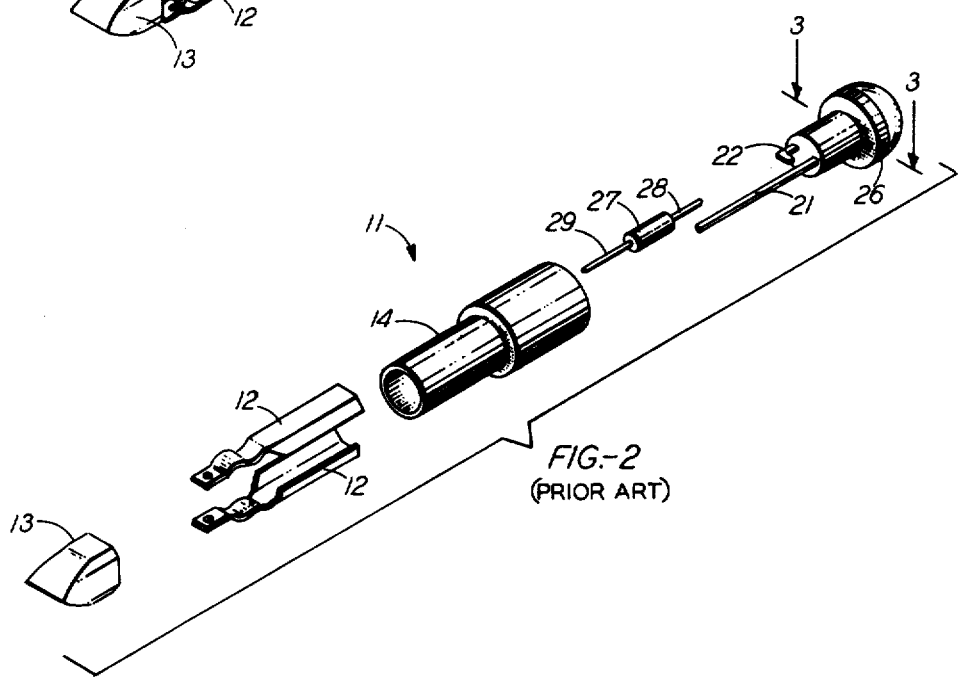
FIG. 2 is an exploded view of the assembled device of FIG. 1, showing the various piece parts from which the prior art device is made.

The device 11 includes a pair of conductive contacts 12 (FIGS. 1 and 2) partly embedded within a molded, tapered insulator 13 and a plastic insulating sleeve 14 to which the contacts 12 are cemented, as shown in FIG. 1. The contacts 12, the insulator 13 and the sleeve 14 form a plug-in type slidebase for the device 11.

Figure 3:
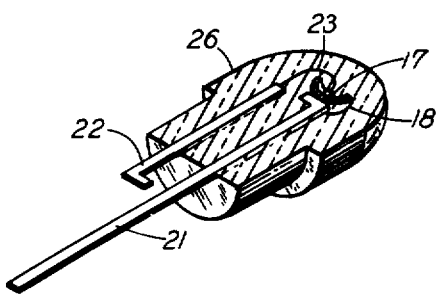
FIG. 3 is a cross-sectional view of a portion of the device of FIG. 2 taken along lines 3—3 of FIG. 2, showing the connections to a light-emitting diode chip.

The device 11 also includes a light-emitting diode chip 17 (FIG. 3), one terminal of which is bonded to a reflector-shaped header 18 formed from, or bonded to, a lead 21. To connect the other terminal of the chip 17 to another lead 22, a wire 23 is bonded to such terminal and to such lead 22. A thin transparent compliant insulating coating (not shown) of a material such as a silicone rubber or an epoxy is preferably applied to the chip 17 after the bonding of the wire 23 thereto. A transparent insulating lens cap 26 is molded about the chip 17, the wire 23, the header 18 and the leads 21 and 22 such that the leads 21 and 22 extend from the cap 26. The cap 26 may be suitably dyed to achieve a desired color.

A resistor 27 (FIG. 2) has its short terminal 28 soldered to the lead 21, which is the positive terminal of the device 11, while its long terminal 29 is soldered to one of the contacts 12. The lead 22 is soldered to the other contact 12.

The prior art device 11 is subject to the aforementioned disadvantages. For example, the assembly of the prior art device 11 requires complex, tedious and time consuming manual operations. In these prior art assembling operations, each device 11 is assembled one at a time which greatly increases assembling costs.

In carrying out such assembling operations, the lens cap 26 (FIG. 3) is molded about the chip 17, the header 18, portions of the leads 21 and 22, and the wire 23 which is appropriately bonded to the chip 17 and the lead 22. In a separate processing the contacts 12 (FIG. 2) are formed and molded into the insulator 13 which separates the contacts 12 from each other. Then, the resistor 27 is properly oriented and held while its short terminal 28 is soldered to the lead 22. Such orientation adds considerably to the assembling cost. The contacts 12, which are partly embedded within the insulator 13, are then cemented to the sleeve 14 which, in turn, is cemented to the lens cap 26. These cementing steps require a curing operation to maximize bond strength. The lead 22 and the long terminal 29 of the resistor 27 are bent slightly outward and manually soldered to the inside of the contacts 12, as shown in FIG. 1. This soldering operation is a very difficult and tedious operation because of the small space between the contacts 12 into which a soldering iron and solder must be inserted. Also, excessive heating from the soldering operation often results in the contacts 12 breaking away from the sleeve 14, either during such soldering operation or during latter use of the device 11.

Light-Emitting Diode Device of the Present Invention

In accordance with the present invention, an electroluminescent display device or light-emitting diode device 31, shown in FIGS. 4 and 5, overcomes many of the disadvantages of the prior art. The device 31 can best be understood by describing the manner in which it is made.

In making a plurality of the devices 31 by batch processing, a lead frame, designated generally by the numeral 32 and shown in FIG. 6, is used. The lead frame 32 includes a pair of elongated, parallel portions 33 and 34, the edges 36 and 37 (FIGS. 4, 5 and 6) of which will form slidable contacts in each completed device 31 (FIG. 4). The portions 33 and 34 are elongated, substantially parallel to each other and substantially adjacent to and spaced from each other. The lead frame 32 also includes a header portion 38 and a lead portion 39, the header portion 38 being unitary with the contact portion 34 in the completed device 31 (FIG. 4).

A plurality of the frames 32, only two of which are shown in FIG. 6, are interconnected by a plurality of support bars 41, 42 and 43, a main support strip 44, which is perforated for ease of handling, and a plurality of tie bars 45. During the assembly of the device 31, the lead portion 39 of each frame 32 is unitary with respect to the contact portion 33 of such frame 32 due to the support bars 43.

The lead frames 32 are stamped from an electrically conductive sheet, typically a copper, nickel and tin alloy. Usually they have various plated layers such as nickel, silver and gold, with any of such layers being the outermost. The frames 32 are substantially planar in configuration and are pliable enough to be rolled up lengthwise about approximately a 3-inch radious with damaging them.

One terminal of a light-emitting element or chip 46 (FIG. 6), typically formed from an appropriately doped semiconductor wafer, is bonded to a reflector 47 of the header portion 38 of the lead frame 32. While only one chip 46 is shown in FIG. 6, it is to be understood that a plurality of chips 46 may be bonded to one or several reflectors 47. A wire 48, advantageously formed of gold, is bonded to the other terminal of the chip 46 and the lead portion 39 of the lead frame 32, both the lead portion 39 and the header portion 38 of the frame 32 being substantially coextensive. A thin transparent, compliant insulating coating (not shown) of a material such as a silicone rubber or an epoxy is applied to the chip 46 after the wire 48 is bonded to it.

A transparent insulating lens cap 49 is then formed with a rounded, light-emitting side and an opposite flat side. A cylindrical projection 51 extends from such flat side of the lens cap 49. The lens cap 49 is formed over the chip 46, the reflector 47, the wire 48 and the header and lead portions 38 and 39 of the lead frame 32, with such portions 38 and 39 extending from the projection 51, as shown in FIG. 6. Advantageously, the lens cap 49 is formed by encapsulation using a casting technique or an injection or a transfer molding technique with a suitable plastic such as that used in the prior art devices therefore desired.

Next, segments 53 and 54 of the bars 43 are removed by any conventional technique such as shearing with a punch and die (not shown), leaving the lead frame 32 as shown in FIG. 7. Then, a pair of terminals 56 of equal length of a current-limiting device, such as a voltage dropping resistor 57 are connected to flag-shaped portions 59 of the lead frame 32, as shown in FIG. 7, by any of the metal joining processes of the prior art, such as soldering, welding or the like. However, welding is preferred. Since the terminals 56 of the resistor 57 are of equal length, the orientation and welding of the resistor 57 is simplified. The resistor 57, which is optional, allows the device 31 to be used over a wide range of operating voltages, including those which are normally used for a filament-type switchboard or key button lamp (not shown) which can be replaced by the light-emitting diode device 31. Typically, this range is from about 6 to about 48 volts. If the resistor 57 is not incorporated in the device 32, the contact portion 34 is made identical to contact portion 33.

After the welding of the resistor 57, an insulating, elongated slidebase 62 (FIGS. 4 and 8) having opposed flat surfaces 63 (FIG. 5) is formed for the device 31 contiguous to and overlapping the projection 51 of the lens cap 49. The slidebase 62 is also formed over the resistor 57 and the contact portions 33 and 34 of the lead frame 32 such that edges 36 and 37 of the contact portions 33 and 34 laterally extend beyond the flat surfaces 63 of the slidebase 62 and are radially disposed about the elongated sides of such slidebase. Typically, the edges 36 and 37 extend approximately 15 mils beyond the flat surfaces 63 of the slidebase 62.

The slidebase 62 is integrally joined to the lens cap 49 and extends substantially the entire length of the contact portions 33 and 34 of the frame 32. The slidebase 62 is also substantially integral between the contact portions 33 and 34 of lead frame 32, and substantially encapsulates the entire device 31. This construction of the slidebase 62 and joining of it to the lens cap 49 results in a very rugged device 31.

Additionally, the slidebase 62 has a tapered end opposite the lens cap 49 to facilitate insertion into a switchboard lamp or similar socket (not shown). The contact portions 33 and 34 have a generally rectangular configuration, with the contact portions 33 and 34 also being generally planar in their configuration, with the plane of the portions 33 and 34 passing through the longitudinal axis of the slidebase 62. The edges 36 and 37 are slidably engageable by the switchboard lamp or similar socket (not shown) and are tapered toward the tapered end of the slidebase 62. The flat surfaces 63 of the slidebase 62 preferably have a rectangular configuration and tend to reduce the rotatability of the device 31 in its socket. This enhances the capability of the device 31 to make proper contact with the power supply (not shown) for its energization.

Preferably, the slidebase 62 is formed by encapsulation such as a casting technique or an injection or a transfer molding process. The material used for the slidebase 62 must be insulating and somewhat wear resistant. Typically, it is an opaque plastic material differing from the material of the lens cap 49 in both its transmissibility of light and its wear-resistance characteristics.

To securely lock the contact portions 33 and 34 of the lead frame 32 to the slidebase 62, a plurality of notches 66 (FIG. 6) having reverse tapered sides and a plurality of apertures 67 are formed in such portions 33 and 34 of the frame 32.

After the slidebase 62 is formed, the portions of the support bars 41, 42 and 43, the main support strip 44, and the tie bar 45, all of which extend beyond the slidebase 62, are severed (see FIG. 8), preferably by a punch base and die (not shown), to separate the devices 31 from each other. A plurality of indentations 69 are formed in the slidebase 62 to allow the punch and die to have an appropriate clearance for severing the bars 41 and 42 flush with the edges 36 and 37 of the contact portions 33 and 34 of the lead frame 32. Another plurality of indentations 70 allows a similar appropriate clearance in severing the support bar 43 from the lead portion 39 of the lead frame 32. Each indentation 70 and each extending support bar 43 is an indication of the polarity of each device 31, such indentation 70 and extending support bar 43 being indicative of the fact that each associated edge 36 is the positive contact of such device 31. The indentation 70 and its extending support bar 43 have the advantage of being a permanent indication of polarity, and are not subject of being worn off as the painted-on indications of polarity of the prior art.

Alternative Embodiments

Shown in FIG. 9 is an alternative embodiment of the device 31 (FIGS. 4 and 5) of the present invention. In this embodiment of FIG. 9, a plurality of recesses 71 are formed in the contact portions 33 and 34 of the lead frame 32 by the punch and die (not shown) when it severs the support bars 41 and 42 from such contact portions 33 and 34. The recesses 71 engage a plurality of detents (not shown) in the switchboard lamp or similar socket (not shown) to more securely hold the device 31 in such socket.

As another alternative embodiment, the lens cap 49 and the slidebase 62 may be formed at the same time and of the same material so as to provide a unitary assembly of the cap 49 and slidebase 62. Of course, the material must be insulating and somewhat wear-resistant. It must also permit a sufficient quantity of light to emit from the chip 46 outwardly beyond the rounded portion of the lens cap 49.

In still another alternative embodiment, the slidebase 62 may be formed of two or more parts with appropriate cavities for the lead frame 32, and such parts may be bonded together, using for example an appropriate adhesive, to embed the appropriate portions of the frame 32 in such slidebase 62.

Figure 10:
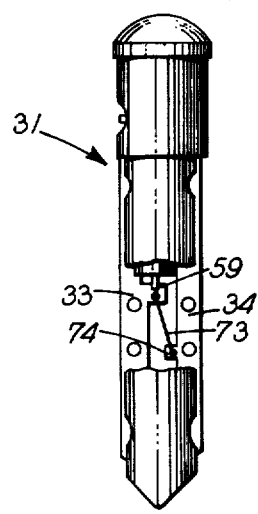
FIGS. 10, 11 and 12 show additional alternative embodiments of the present invention, and show various arrangement of protective elements coupled to the contact members of the device.
Figure 11:
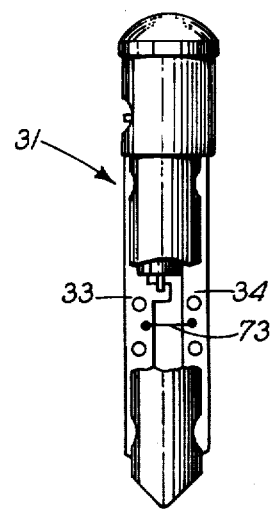
Figure 12:
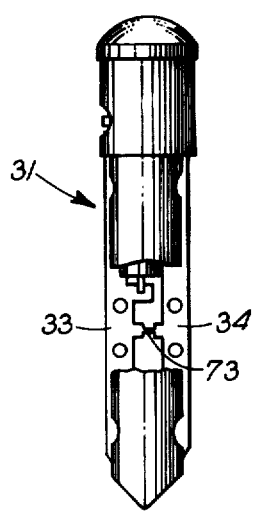

Referring now to FIGS. 10, 11 and 12, other embodiments of the present invention are shown. More specifically, in these figures a protective element 73, which typically is a fusible wire, is shown electrically coupled between the contact portions 33 and 34 of the lead frame 32 (the frame 32 being shown in FIGS. 5, 6 and 7). In FIG. 10 the element 73 is shown bonded to the flag-shaped portion 59 and an additional similarly shaped portion 74 of the lead frame 32, while in FIG. 11 the element 73 is shown bonded directly to the contact portions 33 and 34 of such lead frame 32. The technique used to bond the element 73 to the contact portions 33 and 34 may be anyone of those commonly used in the prior art, such as thermocompression, ultrasonic or conductive epoxy bonding, welding, soldering, brazing or the like.

On the other hand, in FIG. 12 the protective element 73 is shown as being formed as a unitary part of the lead frame 32 (the frame 32 being shown in FIGS. 5, 6 and 7) and as being integral with the contact portions 33 and 34 of such lead frame 32. In making the device 31 of FIG. 12, the element 73 may be formed at the same time that the contact portions 33 and 34 are formed.

Figure 13:
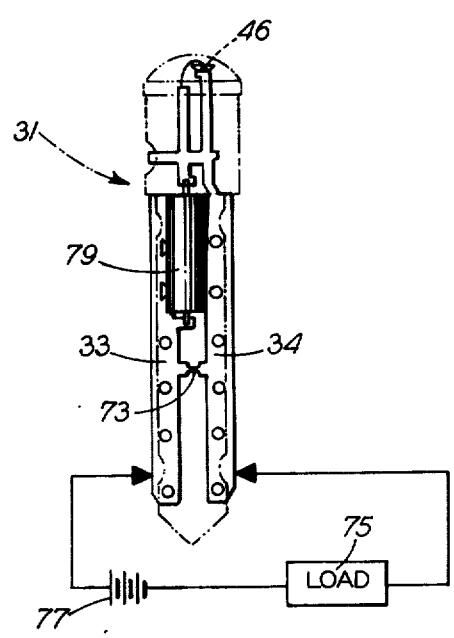
FIG. 13 is a schematic diagram, showing the manner in which the protective device of FIG. 12 may be connected to provide electrical protection for a circuit.

FIG. 13 shows the device of FIG. 12 connected to an electrical circuit including a load 75 and a battery 77. From the circuit, it is apparent that upon an overload condition occurring in the circuit, the protective element 73 melts, vaporizes or is otherwise destroyed, opening the circuit and impressing upon the light-emitting diode chip 46 of the device 31 the voltage from the battery 77 which energizes the chip 46. Thus, the device 31 not only provides circuit protection but also provides a clear and positive indication of the fact that an overload condition has occurred in the circuit of FIG. 13. This indication makes it very quick and easy to determine which of a large number of circuits, each having one of the devices 31 of FIGS. 10–12 connected therein, has developed an overload condition and, therefore, requires some corrective action. Accordingly, the devices 31 of FIGS. 10–12 find ready application in the protection of telephone circuits.

It should be noted that the diode chip 46 is voltage sensitive and operable over a certain voltage range. Accordingly, a current-limiting device such as a voltage-dropping resistor 79, or a current-limiting diode 79 must be selected to limit the current in view of the operating voltage range of the battery 77 so as not to subject the chip 46 to an excessive current and thereby damage it.

It is to be understood that the above-described arrangements are simply illustrative of the application of the principles of the invention. Numerous other arrangements may be readily devised by those skilled in the art which embody the principles of the invention and fall within its spirit and scope.

What is claimed is:

1. An electroluminescent display device, comprising:
at least two elongated, conductive contact members substantially adjacent to and spaced from each other with at least two ends extending partially together and having a light-emitting element electrically coupled between such contact members; and
an elongated insulating base formed about and continuously between the contact members with their elongated outer edges extending beyond the elongated sides of the base, the base extending substantially the entire length of the outer edges of the contact members and being substantially integral between such contact members.

2. The device of claim 1, wherein the contact members are disposed radially about the elongated sides of the base.

3. The device of claim 1, wherein the contact members have a generally planar configuration and are disposed in parallel in the same plane and the plane of the contact members passes through the longitudinal axis of the base.

4. The device of claim 1, wherein a portion of one of the contact members extends beyond the base to indicate the polarity of such contact members.

5. An electroluminescent display device, comprising:
a pair of elongated, conductive, unitary contact members substantially parallel to and spaced from each other with at least two substantially coextensive ends and having a light-emitting element electrically coupled between such coextensive ends with a transparent, insulating lens being formed about such light-emitting element and with the contact members extending longitudinally from and beyond the lens; and
an elongated insulating base contiguous to the lens and formed about and continuously between the contact members to embed the contact members within such base with their outer edges extending beyond the elongated sides of the base, such edges being slidably engageable with terminals of a power source for energizing the light-emitting element, the base extending substantially the entire length and beyond the ends of the contact members that are opposite to the light-emitting element, the base being substantially solid between such contact members and beyond their ends.

6. The device of claim 5, wherein the base overlaps a portion of the lens.

7. In an electroluminescent device having a light-emitting element bonded to a lead frame and a lens formed over the light-emitting element, wherein the improvement comprises:
an insulating base integral with the lens; and
contacts for the device formed from the lead frame and connected to the light-emitting element, said contacts being embedded within the base with the base being continuous between the contacts and with edges thereof extending laterally beyond the base and being slidably engageable.

8. The device of claim 7, wherein the lens and the base are unitary and are formed of the same material.

9. The device of claim 7, wherein a portion of the lead frame is associated with one of the contacts and extends beyond the base to indicate the polarity of such associated contact.

10. The device of claim 7, wherein the base and the contacts are elongated, and the base has opposed, flat surfaces from which the contacts extend for reducing the rotatability of the device in a socket about its longitudinal axis.

11. In a slidebase, plug-in type light-emitting diode replacement for a switchboard lamp having a light-emitting diode chip bonded to a header portion of a lead frame, a lens formed over the header portion of the lead frame and the chip and including a cap member having a rounded side and an opposite flat side with a cylindrical projection extending from such flat side of the cap member, and a voltage-dropping resistor connected between a contact portion of the lead frame and a terminal of the header portion of the lead frame, wherein the improvement comprises:
an elongated plastic insulating base having one end contiguous with the lens and being formed about the projection of the cap member, the opposite end of the base being tapered, the base having opposed, rectangular flat surfaces for reducing the rotatability of the device in a socket about the longitudinal axis of the base and having oppositely arranged indentations on the flat surfaces thereof; and
slidably engageable contacts coupled to the chip and formed from the contact portion of the lead frame, said contacts having a planar, rectangular configuration and being securely embedded within the base and having edges with recesses adjacent the indentations in the base, the edges being tapered toward the tapered end of the base, the edges also extending beyond the flat surfaces of the elongated base, the portion of the contacts embedded within the base having notches and apertures for securing the contacts within the base, the indentations and the recess in the base and the contacts, respectively aiding in retaining the diode replacement in the switchboard lamp socket.

12. In a method of fabricating an electroluminescent device having a light-emitting element bonded to a lead frame and a lens formed over the light-emitting element, wherein the improvement comprises:
forming slidably engageable contacts for the device from the lead frame; and
forming a base for the device integral with the lens and over the lead frame to embed the contacts within the base with the base being continuous between the contacts and with the edges of the contacts extending laterally beyond the surface of the base.

13. The method of claim 12, wherein the base and the lens are formed simultaneously and of the same material.

14. The method of claim 12, wherein the base and the lens are formed sequentially and of different materials.

15. The method of claim 12, wherein the base is formed with opposed, rectangular flat surfaces from which the contacts extend.

16. The method of claim 12, wherein the base is formed of at least two parts that are bounded together to embed the contacts within such base.

17. In a method of fabricating a slidebase, plug-in type light-emitting diode replacement for a switchboard lamp having a light-emitting diode chip, a lens including a cap member having a rounded side and an opposite flat side with a cylindrical projection extending from the flat side of the cap member, wherein the improvement comprises the steps of:
forming a planar lead frame having a header portion to which the light-emitting diode chip is bonded and over which the lens if formed, a first terminal portion connected to such header portion, a second terminal portion bonded to the chip, contact portions, and support bars both interconnecting the internal edges of the terminal portions and connecting the external edges of the contact portions with external edges of the terminal portions:
welding a voltage-dropping resistor between a contact portion and a terminal portion of the lead frame;
severing the support bar interconnecting the internal edges of the terminal portions of the lead frame;
molding a plastic insulating material over the projection of the lens cap and contiguous to the flat side of the cap member and over the resistor and the contact and terminal portions of the lead frame to form an elongated base for the device with the external edges of the contact portions of the lead frame extending laterally beyond the surface of the base; and
severing the support bars interconnecting the external edges of the contact portions and terminal portions of the lead frame.

18. The method of claim 17, wherein the base is molded with a tapered end opposite the lens and the base is molded with an indentation adjacent each support bar that interconnects external edges of the contact and terminal portions of the lead frame, and wherein the severing of the support bars is accomplished with a punch and die by positioning the die in the indentation of the base and wherein the punch forms a notch in the lead frame adjacent the notch in the base.

19. The method of claim 17, wherein the base is molded with opposite flat surfaces from which the external edges of the contact portions of the lead frame extend.

20. The method of claim 17, wherein the resistor has terminals extending from opposite ends thereof which are equal length and such terminals are welded between the contact portion and the terminal portion of the lead frame and wherein the severing of the support bar electrically connects the resistor into the circuit of the chip.

21. The device of claim 1, wherein a protective element is electrically coupled between the contact members so that upon the occurrence of an overload condition in a circuit coupled to the contact members, the protective element decouples the contact members, resulting in the energization of the light-emitting element.

22. A protective device, comprising:
a pair of elongated conductive unitary contact members substantially parallel to and spaced from each other with at least two substantially coextensive ends and having a light-emitting element electrically coupled between such coextensive ends with a transparent, insulating lens being formed about such light-emitting element and with the contact members extending longitudinally from and beyond the lens;
a fusible element electrically coupled between the coextensive ends and being unitary with the contact members; and
an elongated insulating base contiguous to the lens and formed about and continuously between the contact members to embed the contact members and the fusible element within such base with the outer edges of the contact members extending beyond the elongated sides of the base, such edges being slidably engageable with terminals serially interconnected with a power source and a load so that upon the occurrence of an overload condition in the load, the fusible element is destroyed to open the circuit of the load and to impress the voltage of the power source across the light-emitting element to energize it, the base extending substantially the entire length and beyond the ends of the contact members that are opposite to the light-emitting element, the base being substantially solid between such contact members and beyond their ends.

23. The method of claim 12, comprising the additional step of coupling electrically a protective element between the contacts.

24. The device of claim 22, wherein a current-limiting device is serially interconnected with the light-emitting element.

25. The device of claim 24, wherein the current-limiting device is a resistor.

26. The device of claim 24, wherein the current-limiting device is a diode.

* * * * *